Sept. 23, 1958 R. J. FARBER 2,853,602

FREQUENCY-CONVERTER SYSTEM HAVING MIXER AND LOCAL OSCILLATOR GAIN CONTROLLED IN OPPOSITE SENSE

Filed Sept. 27, 1956

United States Patent Office 2,853,602

Patented Sept. 23, 1958

2,853,602

FREQUENCY-CONVERTER SYSTEM HAVING MIXER AND LOCAL OSCILLATOR GAIN CONTROLLED IN OPPOSITE SENSE

Richard J. Farber, New Hyde Park, N. Y., assignor to Hazeltine Research, Inc., Chicago, Ill., a corporation of Illinois Application September 27, 1956, Serial No. 612,555

12 Claims. (Cl. 250—20)

*General*

Figures 1, 2:
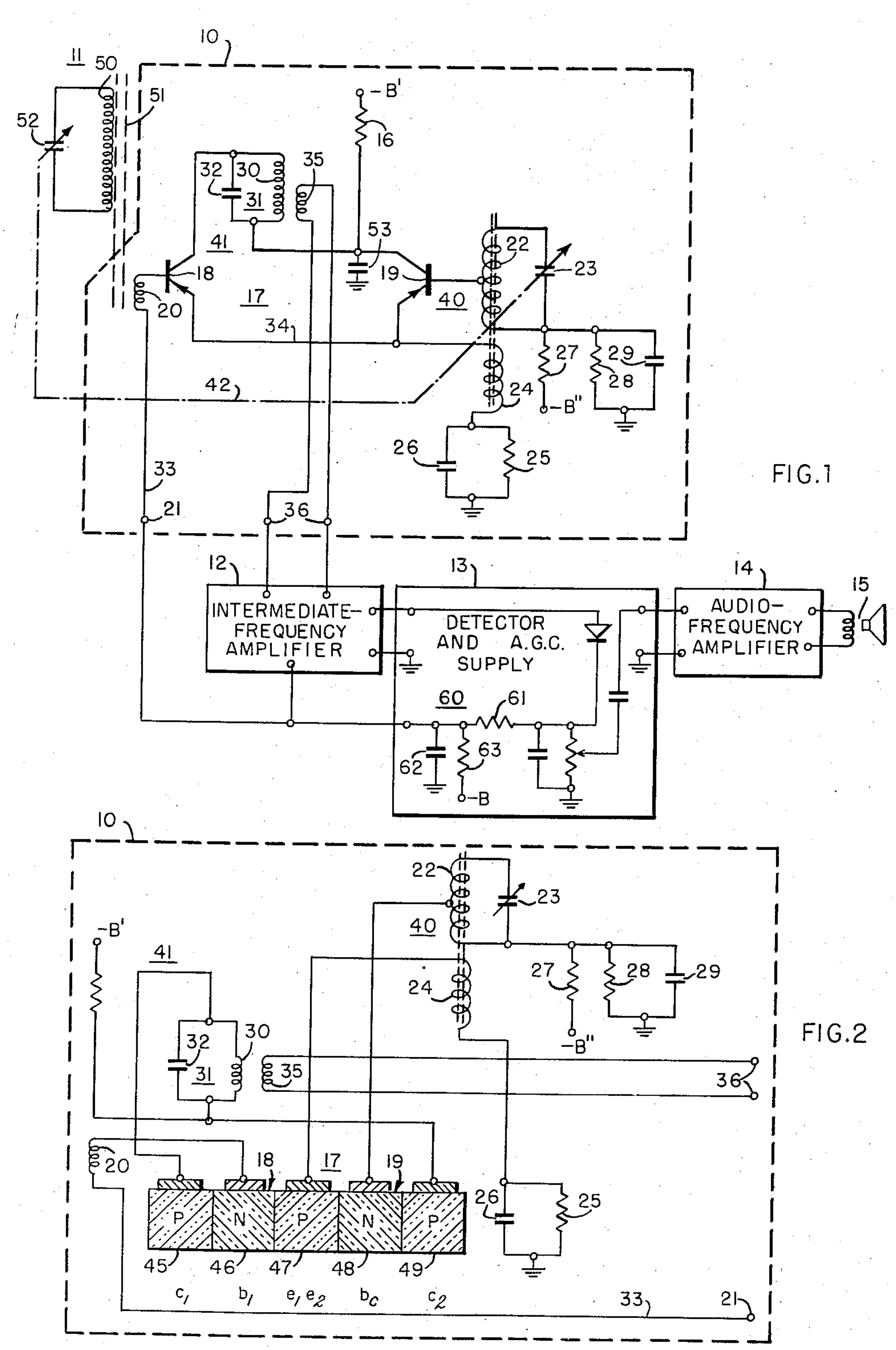

The present invention is directed to signal-translating devices of semiconductive material and, more particularly, to frequency-converter systems employing such devices for converting a wave signal having a given center frequency to a wave signal having a different center frequency. Such converters are particularly useful in radio broadcast receivers and, accordingly, will be described in that connection.

Semiconductor signal-translating devices, commonly referred to as transistors, offer a number of advantages over electron tubes. Their use in both electronic devices and systems is being given widespread attention by equipment designers because of their very small size, lightness of weight, ruggedness, long operating life, extremely simple power requirements, and zero warm-up time. It would seem, therefore, that their use in portable radio broadcast receivers is extremely desirable.

Automatic-gain-control systems, sometimes referred to as automatic-volume-control systems, are employed in signal-translating apparatus such as radio receivers to maintain the signal input to the modulation-signal detector within a relatively narrow range for a wide range of received signal intensities, thereby minimizing any variations in the intensities of the output signal of the sound reproducer which are caused by atmospheric conditions such as fading or caused by tuning the receiver from a strong broadcasting station to a weaker one. Such systems are conventional in radio receivers employing electron tubes and it is considered desirable to employ them in transistorized radio receivers.

Receivers utilizing electron tubes usually employ diodes as the automatic-gain-control detector devices. The current translated by such a diode is small but, upon flowing through a relatively large resistor, develops sufficient voltage for application to the intermediate-frequency stages and/or the radio-frequency stages of a receiver. This developed voltage controls the gain of the stages just mentioned with negligible power consumption and maintains the signal input to the modulation-signal detector within a relatively narrow range for a wide range of received signal intensities.

It would initially appear that techniques employed in automatic-gain-control systems using electron tubes could readily be carried over into automatic-gain-control systems for receivers employing transistors. However, the problem has proved to be quite complex because the input impedance of a transistor is lower than that of an electron tube so that more power must be delivered to the controlled stages employing transistors. The current flowing in the input circuits of the controlled stages is significant and must also be considered. Because of this complexity of the transistor, the use of transistor automatic-gain-control systems has been rather limited. Furthermore, this use has ordinarily been restricted to one or more of the intermediate-frequency amplifier stages of the receiver.

In order effectively and automatically to control the gain of a receiver, it is desirable for some applications to control the gain of the signal being translated before it acquires a relatively large amplitude. This would reduce the possibility of overloading succeeding stages during the reception of signals of large intensity. To this end, it would seem advantageous to apply a gain-control potential to the radio-frequency amplifier and/or the oscillator-modulator or frequency-converter system of a transistorized radio receiver. Heretofore this has proved to be generally unsatisfactory for reasons presently to be mentioned. Many transistorized radio receivers do not employ radio-frequency amplifiers and, hence, the gain control must be effected in succeeding stages. A common form of frequency-converter system in such receivers employs an oscillator which includes a first transistor and a frequency converter or modulator which includes a second transistor. If one of the signals of such a frequency converter, usually the applied radio-frequency signal, is considerably weaker than the other, which is therefore the local oscillator signal, then the intermediate-frequency output signal tends to be a function of that weaker signal. Frequency-converter systems of the type under consideration operate satisfactorily under this condition. However, when the intensity of the input signal increases, the amplitude of that signal approaches that of the local oscillations. Amplitude variations of the local oscillator signal originating from various causes such as fluctuations in the power supply now become important since these variations tend to appear in the derived interemdiate-frequency output signal. In many transistor receivers this has sometimes resulted in microphonic action when strong radio-frequency signals are applied to the frequency-converter system. Applicant has determined that such feed-back troubles can be avoided by permitting the amplitude of the local oscillations to increase as the developed gain-control bias builds up in a sense which would reduce the gain of the converter.

Autodyne frequency converters making use of a single transistor have been employed in radio receivers. It has been found impractical to apply gain control to such converters since a large value of gain-control bias developed when strong signals are received causes the oscillator portion of the converter to cease operating. This not only disables the converter but prevents the receiver from performing its intended function.

It is an object of the invention, therefore, to provide a new and improved frequency-converter system which avoids one or more of the above-mentioned disadvantages of prior such systems employing transistors.

It is another object of the invention to provide a new and improved frequency-converter system having a gain which can be successfully controlled without creating undesirable microphonic action in a receiver employing that system.

It is still further object of the invention to provide a new and improved frequency-converter system wherein the local oscillator excitation increases as the gain-control bias builds up as a result of the reception of received signals of increasing intensity.

It is yet another object of the present invention to provide a new and improved signal-translating device which includes a body of semiconductive material.

It is an additional object of the invention to provide a new and improved frequency-converter system which employs a unitary body of semiconductive material that forms a pair of junction transistors.

In accordance with a particular form of the invention, a frequency-converter system comprises constant-current supply means and a device effectively including first and second transistors coupled in parallel to the supply means and each including a base, an emitter, and a collector. The frequency-converter system also includes a signal input circuit coupled to the base and emitter of the first transistor, an oscillation generator including that second transistor, and a converter which includes the first transistor and an output circuit and is effective to derive a beat-frequency signal in that output circuit from the input signal and the generated oscillations. The frequency-converter system still further includes control-potential supply means coupled between the base and the emitter of the first transistor for controlling the magnitude of the collector current thereof and the gain of the converter in one sense and the magnitude of the collector current and the amplitude of the generated oscillations in the opposite sense.

For a better understanding of the present invention, together with other and further objects thereof, reference is had to the following description taken in connection with the accompanying drawing, and its scope will be pointed out in the appended claims.

Referring to the drawing:

Fig. 1 is a circuit diagram, partly schematic, of a complete radio broadcast receiver which includes a frequency-converter system embodying the present invention in a particular form, and Fig. 2 is a modification of the frequency-converter system of Fig. 1.

*General description of Fig. 1 receiver*

Referring now to Fig. 1 of the drawing, there is represented a complete radio broadcast receiver which utilizes a frequency-converter system embodying a particular form of the present invention. In general, the receiver includes a frequency-converter system or oscillator-modulator 10 having a received wave-signal input circuit constituting an antenna system such as one commonly referred to in the art as a "ferrite rod antenna" 11 and having its output circuit coupled to an intermediate-frequency amplifier 12 of one or more stages. The antenna 11 includes a winding 50 which is disposed on an elongated ferromagnetic rod 51 and is tuned to the frequency of the received wave signal by an adjustable condenser 52. The intermediate-frequency amplifier 12 is connected in cascade with a modulation-signal detector and AGC supply 13, an audio-frequency amplifier 14, and a sound-reproducing device 15. While the detector and AGC supply may be one of the type for deriving modulation-signal components of an amplitude-modulated wave signal or one for deriving the corresponding components of a frequency-modulated wave signal, for the purpose of describing a particular embodiment of the present invention it will be considered to be a detector for an amplitude-modulated wave signal. Unit 13 further includes conventional means for deriving a suitable gain-control effect for application to the frequency-converter system 10 and, if desired, to the intermediate-frequency amplifier 12 to maintain the amplitude of the signal input to the detector of unit 13 within a relatively narrow range for a wide range of received signal intensities. To that end, the AGC supply portion of unit 13 includes a conventional filter network 60 comprising a series-connected resistor 61 and a shunt-connected condenser 62. A source of negative potential indicated as —B is connected through a resistor 63 to the junction of the resistor 61 and the condenser 62 for supplying a suitable negative biasing potential for the purpose to be explained subsequently.

It will be understood that the units just described, with the exception of the frequency-converter system 10 in accordance with a particular form of the present invention, may be of conventional construction and operation the details of which are well known in the art so that further detailed description and explanation of the operation thereof are unnecessary.

*General operation of Fig. 1 receiver*

Considering briefly the operation of the Fig. 1 receiver as a whole but neglecting for the moment the details of the operation of the frequency-converter system 10 which will be explained subsequently, the desired amplitude-modulated wave signal intercepted by the antenna 11 is applied to the frequency-converter system and is converted by the latter to an amplitude-modulated intermediate-frequency wave signal which is translated by the output circuit of unit 10 to the intermediate-frequency amplifier 12 for amplification therein. The output signal of the intermediate-frequency amplifier is applied to the detector 13 which derives the audio-frequency modulation components of the received wave signal. These components are, in turn, amplified by the audio-frequency amplifier 14 and are reproduced by the sound-reproducing device 15 in a conventional manner. The automatic-gain-control bias derived in unit 13 and applied by filter network 60 to the frequency-converter system 10 and the intermediate-frequency amplifier 12 is effective to maintain the intensity of the signal input to the detector within a relatively narrow range for a wide range of received signal intensities.

*Description of frequency-converter system 10 of Fig. 1*

Referring now more particularly to Fig. 1 of the drawing, the frequency-converter system 10 there represented comprises a device 17 effectively including a pair of transistors 18 and 19 each of which includes a base, an emitter, and a collector. These transistors may be of like conductivity type and preferably are junction transistors. It will be understood that these transistors may be of the grown-junction type, alloy-junction type, or other suitable junction type. For convenience, it will be considered that both transistors are of the PNP junction type. While the device 17 has been represented as being a pair of individual transistors 18 and 19, it will be understood that the device may be a unitary structure which effectively comprises a pair of transistors. Such a structure is represented in Fig. 2 and will be considered in detail subsequently.

The device 17 is effectively coupled in parallel to a constant-current supply means which includes a source indicated as —B′ and a resistor 16 having a high resistive impedance. One terminal of the resistor 16 is connected to the source —B′ while the other terminal is connected directly to the collector of the transistor 19 and is also connected to the collector of the transistor 18 through a winding 30 of a resonant circuit 31 which is tuned to resonance by a condenser 32. The connection from the resistor 16 to the collector of transistor 19 is connected to ground through an intermediate-frequency by-pass condenser 53. The emitters of the transistors 18 and 19 are interconnected by means of a conductive connection such as a wire 34 which, in turn, is connected to ground through a winding 24 and a resistor 25 which is shunted by a condenser 26. It will be understood that for other embodiments of the invention, the connecting means between the emitters of transistors 18 and 19 may be something other than a wire for effectively making a direct or conductive connection and this will also be made clear hereinafter with reference to the Fig. 2 modification of the invention. Elements 24, 25, and 26 will be described in greater detail subsequently.

The frequency-converter system 10 additionally includes a signal input circuit coupled to the base and the emitter of the first transistor 18. This input circuit comprises a winding 20 which is disposed on the ferromagnetic rod 51 and is magnetically coupled to the winding 50 of the antenna 11. One terminal of the winding 20 is connected to the base of transistor 18 while the other terminal is connected through a wire 33 and an input terminal 21 to the resistor 63 and the source indicated as —B in the AGC supply circuit of unit 13. The values of the resistors 63 and 25, condenser 26, and the potential of the source —B are selected to bias the emitter of transistor 18 slightly positive with reference to the base, that is, in the direction of good current conductivity. It will be noted that the voltage supplied to the base of transistor 18 is negative with respect to ground and the AGC potential supplied from unit 13 is one which is positive going (that is, less negative) with a received wave signal of increasing intensity.

The frequency-converter system 10 further comprises an oscillation generator 40 that includes the second transistor 19. This generator includes a winding 22 tuned to resonance by means of an adjustable condenser 23 which is arranged for ganged operation with the adjustable condenser 52 of the antenna 11 in a well-known manner by means represented diagrammatically by the dot-dash line 42. An intermediate point of the winding 22 is connected to the base of transistor 19 while one terminal of the condenser 23 is connected to ground through the parallel combination of a resistor 28 and a condenser 29 and is also connected to a source of operating potential indicated as —B″ through a resistor 27. The values of the resistors 27, 28, and 16, condenser 29, and the potentials of the sources —B′ and —B″ are selected so that the collectors of the transistors 18 and 19 are biased in the direction of poor conductivity and, thus, in the reverse direction. The winding 24 constitutes a tickler winding for the oscillation generator and, hence, is inductively coupled to the tuned winding 22 thereby providing a regenerative oscillatory system.

The frequency-converter system 10 also comprises a converter 41 which includes the first transistor 18 and an output circuit and is effective to derive a beat-frequency signal in that output circuit from the input signal applied to the winding 20 and that developed by the oscillation generator 40. This output circuit includes a secondary transformer winding 35 which is conductively connected to a pair of output terminals 36, 36 for unit 10 and is inductively coupled to the primary winding 30 of the circuit 31. The latter is tuned to the beat-frequency or heterodyne-difference signal which is derived in the converter 41 by virtue of the nonlinear signal-translating characteristic of the transistor 18. This signal constitutes an intermediate-frequency output signal. The oscillations generated by unit 40 are supplied to the converter 41 by means of the wire 34 interconnecting the emitters of transistors 18 and 19.

A control-potential supply means in the form of the AGC input terminal 21 and the wire 33 connected to the winding 20 is coupled between the base and the emitter of the first transistor 18 for controlling the magnitude of the collector current of that transistor and the gain of the converter 41 in one sense while simultaneously controlling the magnitude of the collector current of said second transistor and the amplitude of the oscillations generated by oscillation generator 40 in the opposite sense.

*Operation of frequency-converter system 10 of Fig. 1*

In considering the operation of the frequency-converter system 10, it will be assumed initially that the sources —B, —B′, and —B″ and the various resistors such as resistors 63, 16, 25, 27, and 28 develop the correct direct-current operating potentials for transistors 18 and 19. The oscillation generator 40 by virtue of its regenerative oscillatory system develops local oscillations in a conventional manner and these are supplied by the winding 24 to the emitter electrode of the transistor 18 of the converter 41. The received wave signal intercepted by the antenna 11 is applied to the winding 20 in the emitter-base circuit of transistor 18. The nonlinear signal-translating characteristic of the transistor 18 of the converter 41 is such that it functions as a heterodyne detector and derives heterodyne components in the collector output circuit of the transistor. The heterodyne-difference components are selected by the resonant circuit 31 which is tuned to the desired intermediate frequency and are applied by the winding 35 in the output circuit of the converter through the terminals 36, 36 to the intermediate-frequency amplifier 12 for use in a manner explained above in connection with the general operation of the receiver.

As the average intensity of the received wave signal increases, the gain-control potential derived by the AGC supply of unit 13 becomes more positive. Since this control potential is applied by terminal 21 and conductor 33 through winding 20 to the base of transistor 18 of the converter 41, it reduces the magnitude of the collector current and the gain of converter 41. Since the collectors of transistors 18 and 19 are connected to a constant-current supply means, a reduction of the collector current of transistor 18 causes the flow of additional collector current in the transistor 19 of the oscillation generator 40. Expressed somewhat differently, it may be said that the application of a more positive bias to the emitter-base circuit of transistor 18 causes the collector of the transistor 19 to rob current from the collector of the transistor 18 because the two transistors are effectively coupled in parallel to the constant-current supply means. The reduction in the collector current of the converter 41 reduces the conversion gain of the system 10 and, hence, the average amplitude of the signal translated by the output circuit of the converter to the input circuit of the intermediate-frequency amplifier. This, in turn, tends to cause the average amplitude of the signal applied to the detector of unit 13 to vary more slowly than the average amplitude of the received wave signal. The reduction in the gain of converter 41 and the consequent increase in the collector current of the oscillation generator 40 cause the latter to oscillate more strongly and, hence, develop larger amplitude signals for application to the emitter of the transistor 18 of the converter. In a conventional transistor frequency converter, an increase in the average amplitude of the received wave signal would cause that applied wave signal to approach the amplitude of the local oscillations and amplitude variations of the local oscillations would then tend to appear at the output terminals of the frequency-converter system. As previously mentioned, such a condition could result in undesirable feedback. In the frequency-converter system of the present invention, it has been shown that an increase in the average amplitude of the received wave signal causes the generated oscillations to be of greater amplitude while, at the same time, the conversion gain of the system is reduced. As previously stated, applicant has determined that when the amplitude of the local oscillations increases substantially simultaneously with an increase in the average amplitude of the received wave signal, undesired acoustic feedback of the type mentioned above does not occur. Accordingly, the frequency-converter system of the present invention not only provides frequency conversion together with gain control thereof as needed but also affords improved oscillator action which avoids or minimizes undesirable feedback.

Conversely, when the average amplitude of the received wave signal decreases, the intensity of the signal applied to winding 20 of the frequency converter is reduced and the magnitude of the gain-control potential supplied to the emitter-base circuit of transistor 18 is also reduced, thus increasing the conversion gain and reducing the amplitude of the generated local oscillations. Thus, it may be said that the gain-control potential supply means for the frequency converter 10 controls the magnitude of the collector current of the first transistor and the gain of the converter in one sense and the magnitude of the collector current and the amplitude of the generated oscillations in the opposite sense.

*Description of Fig. 2 frequency-converter system 10*

Referring now to Fig. 2 of the drawing, there is represented a system which is substantially identical with that of Fig. 1 but for the geometry of the device 17 comprising the pair of transistors 18 and 19. Corresponding elements in the two figures are designated by the same reference numerals. Instead of employing a pair of discrete transistors 18 and 19 having the emitter of the former conductively connected as by a wire to the emitter of the latter, the device 17 of Fig. 2 is a unitary body of semiconductive material which is arranged in a predetermined pattern of five successive zones 45–49, inclusive. This pattern may comprise five successive zones, contiguous ones of which are of opposite conductivity types such as the PNPNP types as represented. It will be understood that an NPNPN type device may be employed if desired, in which case operating potentials of opposite polarity are supplied. The first zone 45 of one conductivity type constitutes the collector of the first transistor 18; the second zone 46 of the opposite conductivity type forms the first junction with the first zone on constitutes the base of the first transistor; the third zone 47 of the one conductivity type forms a second junction with the second zone and constitutes the emitters of the two transistors; the fourth zone 48 of the opposite conductivity type forms a third junction with the third zone 47 and constitutes the base of the second transistor 19; while the fifth zone 49 of the one conductivity type forms a fourth junction with the fourth zone 48 and constitutes the collector of the second transistor. The use of the unitary device 17 such as represented in Fig. 2 has the advantage of simplifying manufacturing problems by eliminating the need of making two direct connections which, in turn, are built into the device there represented. Less work and material are, therefore, required in constructing the transistor. The general operation of the frequency-converter system of Fig. 2 is substantially the same as that of the system of Fig. 1 and, hence, will not be repeated.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A frequency-converter system comprising: constant-current supply means; a device effectively including first and second transistors coupled in parallel to said means and each including a base, an emitter, and a collector; a signal input circuit coupled to the base and emitter of said first transistor; an oscillation generator including said second transistor; a converter which includes said first transistor and an output circuit and is effective to derive a beat-frequency signal in said output circuit from the input signal and the generated oscillations; and control-potential supply means coupled between said base and emitter of said first transistor for controlling the magnitude of the collector current thereof and the gain of said converter in one sense and the magnitude of the collector current of said second transistor and the amplitude of said generated oscillations in the opposite sense.

2. A frequency-converter system comprising: constant-current supply means; a device effectively including first and second transistors of like conductivity type coupled in parallel to said means and each including a base, an emitter, and a collector; a signal input circuit coupled to the base and emitter of said first transistor; an oscillation generator including said second transistor; a converter which includes said first transistor and an output circuit and is effective to derive a beat-frequency signal in said output circuit from the input signal and the generated oscillations; and control-potential supply means coupled between said base and emitter of said first transistor for controlling the magnitude of the collector current thereof and the gain of said converter in one sense and the magnitude of the collector current of said second transistor and the amplitude of said generated oscillations in the opposite sense.

3. A frequency-converter system comprising: constant-current supply means; a device effectively including first and second transistors of like conductivity type coupled in parallel to said means and each including a base, an emitter, and a collector, said emitters being conductively interconnected and said collectors being conductively interconnected; a signal input circuit coupled to the base and emitter of said first transistor; an oscillation generator including said second transistor; a converter which includes said first transistor and an output circuit coupled to the collector of said first transistor and is effective to derive a beat-frequency signal in said output circuit from the input signal and the generated oscillations; and control-potential supply means coupled between said base and emitter of said first transistor for controlling the magnitude of the collector current thereof and the gain of said converter in one sense and the magnitude of the collector current of said second transistor and the amplitude of said generated oscillations in the opposite sense.

4. A frequency-converter system comprising: constant-current supply means; a device effiectively including first and second transistors coupled in parallel to said means and each including a base, an emitter, and a collector, said emitters being electrically integral; a signal input circuit coupled to the base and emitter of said first transistor; an oscillation generator including said second transistor; a converter which includes said first transistor and an output circuit and is effective to derive a beat-frequency signal in said output circuit from the input signal and the generated oscillations; and control-potential supply means coupled between said base and emitter of said first transistor for simultaneously controlling the magnitude of the collector current thereof and the gain of said converter in one sense and the magnitude of the collector current of said second transistor and the amplitude of said generated oscillations in the opposite sense.

5. A frequency-converter system comprising: constant-current supply means; a device effectively including first and second transistors coupled in parallel to said means, said device including a unitary body of semiconductive material arranged in a predetermnied pattern of five zones, contiguous ones of which are of opposite conductivity types, one of said zones constituting the collector of said first transistor, another the base thereof, another the emitters of said transistors, another the base of said second transistor, and another the collector thereof; a signal input circuit coupled to the base and emitter of said first transistor; an oscillation generator including said second transistor; a converter which includes said first transistor and an output circuit and is effective to derive a beat-frequency signal in said output circuit from the input signal and the generated oscillations; and control-potential supply means coupled between said base and emitter of said first transistor for controlling the magnitude of the collector current thereof and the gain of said converter in one sense and the magnitude of the collector current of said second transistor and the amplitude of said generated oscillations in the opposite sense.

6. A frequency-converter system comprising: constant-current supply means; a device effectively including first and second transistors coupled in parallel to said means, said device including a unitary body of semiconductive material of five successive zones, contiguous ones of which are of opposite conductivity types, the first of said zones constituting the collector of said first transistor, the second the base thereof, the third the emitters of said transistors, the fourth the base of said second transistor, and the fifth the collector thereof; a signal input circuit coupled to the base and emitter of said first transistor; an oscillation generator including said second transistor; a converter which includes said first transistor and an output circuit and is effective to derive a beat-frequency signal in said output circuit from the input signal and the generated oscillations; and control-potential supply means coupled between said base and emitter of said first transistor for controlling the magnitude of the collector current thereof and the gain of said converter in one sense and the magnitude of the collector current of said second transistor and the amplitude of said generated oscillations in the opposite sense.

7. A frequency-converter system comprising: constant-current supply means; a device effectively including first and second transistors coupled in parallel to said means, said device including a unitary body of semiconductive material arranged in a predetermined pattern of five zones of the PNPNP conductivity types, one of said zones of the P type constituting the collector of said first transistor, one of said zones of the N type constituting the base of said first transistor, another of said zones of the P type constituting the emitters of said transistors, another of said zones of the N type constituting the base of said second transistor, and the other of said zones of the P type constituting the collector of said second transistor; a signal input circuit coupled to the base and emitter of said first transistor; an oscillation generator including said second transistor; a converter which includes said first transistor and an output circuit and is effective to derive a beat-frequency signal in said output circuit from the input signal and the generated oscillations; and control-potential supply means coupled between said base and said emitter of said first transistor for controlling the magnitude of the collector current thereof and the gain of said converter in one sense and the magnitude of the collector current of said second transistor and the amplitude of said generated oscillations in the opposite sense.

8. A frequency-converter system comprising: constant-current supply means; a device effectively including first and second transistors coupled in parallel to said means, said device including a unitary body of semiconductive material having a first zone of one conductivity type constituting the collector of said first transistor, a second zone of the opposite conductivity type forming a first junction with said first zone and constituting the base of said first transistor, a third zone of said one type forming a second junction with said second zone and constituting the emitters of said transistors, a fourth zone of said opposite type forming a third junction with said third zone and constituting the base of said second transistor, and a fifth zone of said one type forming a fourth junction with said fourth zone and constituting the collector of said second transistor; a signal input circuit coupled to the base and emitter of said first transistor; an oscillation generator including said second transistor; a converter which includes said first transistor and an output circuit and is effective to derive a beat-frequency signal in said output circuit from the input signal and the generated oscillations; and control-potential supply means coupled between said base and emitter of said first transistor for controlling the magnitude of the collector current thereof and the gain of said converter in one sense and the magnitude of the collector current of said second transistor and the amplitude of said generated oscillations in the opposite sense.

9. A frequency-converter system for a radio receiver comprising: constant-current supply means; a device effectively including first and second PNP junction transistors coupled in parallel to said means and each including a base, an emitter, and a collector; a received wave-signal input circuit coupled to the base and emitter of said first transistor; an oscillation generator including said second transistor; a converter which includes said first transistor and an output circuit and is effective to derive an intermediate-frequency signal in said output circuit from the input wave signal and the generated oscillations; and control-potential supply means coupled between said base and emitter of said first transistor for controlling the magnitude of the collector current thereof and the gain of said converter in one sense and the magnitude of the collector current of said second transistor and the amplitude of said generated oscillations in the opposite sense.

10. A frequency-converter system comprising: a device effectively including first and second transistors of like conductivity type, each effectively including a base, an emitter, and a collector; means effectively connecting the emitter of said first transistor directly with the emitter of said second thereof; a constant-current supply means conductively connected to said collectors; a signal input circuit coupled to the base and emitter of said first transistor; an oscillation generator including said second transistor; a converter which includes said first transistor and an output circuit coupled to the collector of said first transistor and which is effective to derive a beat-frequency signal in said output circuit from the input signal and the generated oscillations; and control-potential supply means coupled between said base and emitter of said first transistor for controlling the magnitude of the collector current thereof and the gain of said converter in one sense and the magnitude of the collector current of said second transistor and the amplitude of said generated oscillations in the opposite sense.

11. A frequency-converter system comprising: a device effectively including first and second transistors of like conductivity type, each effectively including a base, an emitter, and a collector; means effectively connecting the emitter of said first transistor directly with the emitter of said second thereof; a constant-current supply means conductively connected to said collectors; a signal input circuit coupled to the base and emitter of said first transistor and including means biasing said emitters in the forward direction; an oscillation generator including said second transistor; means including said supply means biasing said collectors in the reverse direction; a converter which includes said first transistor and an output circuit coupled to the collector of said first transistor and which is effective to derive a beat-frequency signal in said output circuit from the input signal and the generated oscillations; and control-potential supply means coupled between said base and emitter of said first transistor for controlling the magnitude of the collector current thereof and the gain of said converter in one sense and the magnitude of the collector current of said second transistor and the amplitude of said generated oscillations in the opposite sense.

12. An automatic-gain-control system for a radio receiver comprising: constant-current supply means; first and second transistors having input and output connections and coupled in parallel to said supply means; a received wave-signal input circuit coupled to said input connections of said first transistor; a local oscillator including said second transistor coupled to said input connections of said first transistor; a converter including said first transistor and which is effective to derive at said output connections thereof an intermediate-frequency wave signal from said received signal and the local oscillations; and means coupled to said input connections of the first transistor for supplying a gain-control potential thereto, whereby the currents in the output connections of the transistors vary in opposite senses so that the gain of the converter and the magnitude of the local oscillations vary in opposite senses.

References Cited in the file of this patent

UNITED STATES PATENTS

| | | |
|---|---|---|
| 2,623,102 | Shockley | Dec. 23, 1952 |
| 2,713,117 | Haegele | July 12, 1955 |

(Other references on following page)

FOREIGN PATENTS 421,786 Great Britain ---------- Dec. 31, 1934

OTHER REFERENCES

"An Experimental Automobile Receiver Employing Transistors," by Freedman et al. Proceedings of the Institute of Radio Engineers, June 1955, pages 671 to 678 of which only pages 672 and 673 are relied on.

"Automatic Gain Control of Transistor Amplifiers," by Chow et al. Proceedings of Institute of Radio Engineers, September 1955, pages 1119 to 1127 of which only page 1127 is relied on.

"The Transistor as a Mixer," by Zawels. Proceedings of the Institute of Radio Engineers, March 1954, pages 542 to 548.